United States Patent
Abazarnia et al.

(10) Patent No.: US 6,819,130 B2
(45) Date of Patent: Nov. 16, 2004

(54) FLOATING AND SELF-ALIGNING SUSPENSION SYSTEM TO AUTOMATICALLY ALIGN AND ATTACH A CONNECTOR TO AN ASSEMBLY

(75) Inventors: Nader N. Abazarnia, Chandler, AZ (US); Jeffrey H. Luke, Gilbert, AZ (US); Nader Shahriari, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 09/858,223

(22) Filed: May 15, 2001

(65) Prior Publication Data

US 2002/0171444 A1 Nov. 21, 2002

(51) Int. Cl.[7] .............................................. G01R 31/02
(52) U.S. Cl. ..................... 324/758; 324/158.1; 439/152
(58) Field of Search .............................. 324/758, 765, 324/754, 158.1, 751; 439/152, 160, 153, 491, 157, 155, 159; 361/686, 685, 724, 727

(56) References Cited

U.S. PATENT DOCUMENTS

| 4,642,735 A | * | 2/1987 | Hodsdon et al. ............. 361/816 |
| 5,485,672 A | * | 1/1996 | Carpenter et al. ............. 29/841 |
| 5,704,619 A | * | 1/1998 | Mitchell et al. ....... 280/11.216 |
| 6,088,222 A | * | 7/2000 | Schmitt et al. ............. 361/686 |
| 6,361,335 B1 | * | 3/2002 | Calanni et al. ............. 439/152 |

* cited by examiner

*Primary Examiner*—Kamand Cuneo
*Assistant Examiner*—Jimmy Nguyen
(74) *Attorney, Agent, or Firm*—Schwegman, Lundberg, Woessner & Kluth, P.A.

(57) ABSTRACT

A floating and self-aligning suspension system to automatically align and attach a connector to an assembly is disclosed. The floating and self-aligning suspension system includes a frame and a biasing mechanism attached to the frame. A connector is mounted to the frame and the biasing mechanism permits the frame and connector to move relative to another structure to allow the connector to self-align and attach to an assembly.

20 Claims, 8 Drawing Sheets

FLOATING AND SELF-ALIGNING SUSPENSION SYSTEM TO AUTOMATICALLY ALIGN AND ATTACH A CONNECTOR TO AN ASSEMBLY

FIELD OF THE INVENTION

The present invention relates generally to integrated circuits, and more particularly to a floating and self-aligning suspension system to automatically align and connect a connector to tabs on an integrated circuit cartridge, such as the power tabs on a processor chip or the like.

BACKGROUND INFORMATION

Typically, integrated circuit (IC) packages have utilized either a pin array or a substrate tab that extends in only one direction to make connections to the IC package. Either a connector was slipped onto the tab or the pin array was inserted into a socket on a substrate, printed circuit board (PCB) or the like. In either situation the IC package only had to move in one direction or along one axis to make the connection. Because the pin array or tab extends in only one direction and the package only needs to move in one direction, this makes the use of mechanical systems, such as robots, actuators and other similar mechanical devices, for placement of ICs onto a PCB in high speed, automated manufacturing and testing systems simple. The robot or mechanical system only has to move the IC package in one direction to correctly place the IC in the socket in a repeatable and reliable manner or to attach the connector to the tab.

Some more recent IC packages, such as high powered central processing units (CPUs) and the like, utilize both a pin array extending in one direction or axis and a tab extending in another direction or axis. For example, the pin array may be used for communicating and sending signals to other components, to input and output interfaces and the like, and the tab connector may be used for connecting power to the IC or CPU. For high powered CPUs, this separates the power and signal wiring to minimize noise and interference. The two directions of motion required to properly connect or socket the IC or CPU package into the socket and the tab into a connector complicate the design and use of high speed, automated manufacturing systems and testing systems. Assembly tolerances for placement of the pin array and the tab usually leave little margin for error. In such manufacturing and testing environments, the mechanical and robotic systems must reliably socket the package every time. Any mis-socketing can cause an IC or CPU to be incorrectly rejected as non-functional and can even damage the CPU or manufacturing or testing equipment resulting in lost yield and equipment down time.

Accordingly, for the reason stated above, and for other reasons that will become apparent upon reading and understanding the present specification, there is a need for a floating and self-aligning suspension system to reliably align and permit insertion of a connector onto the tab of an IC or CPU during a manufacturing or testing operation.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
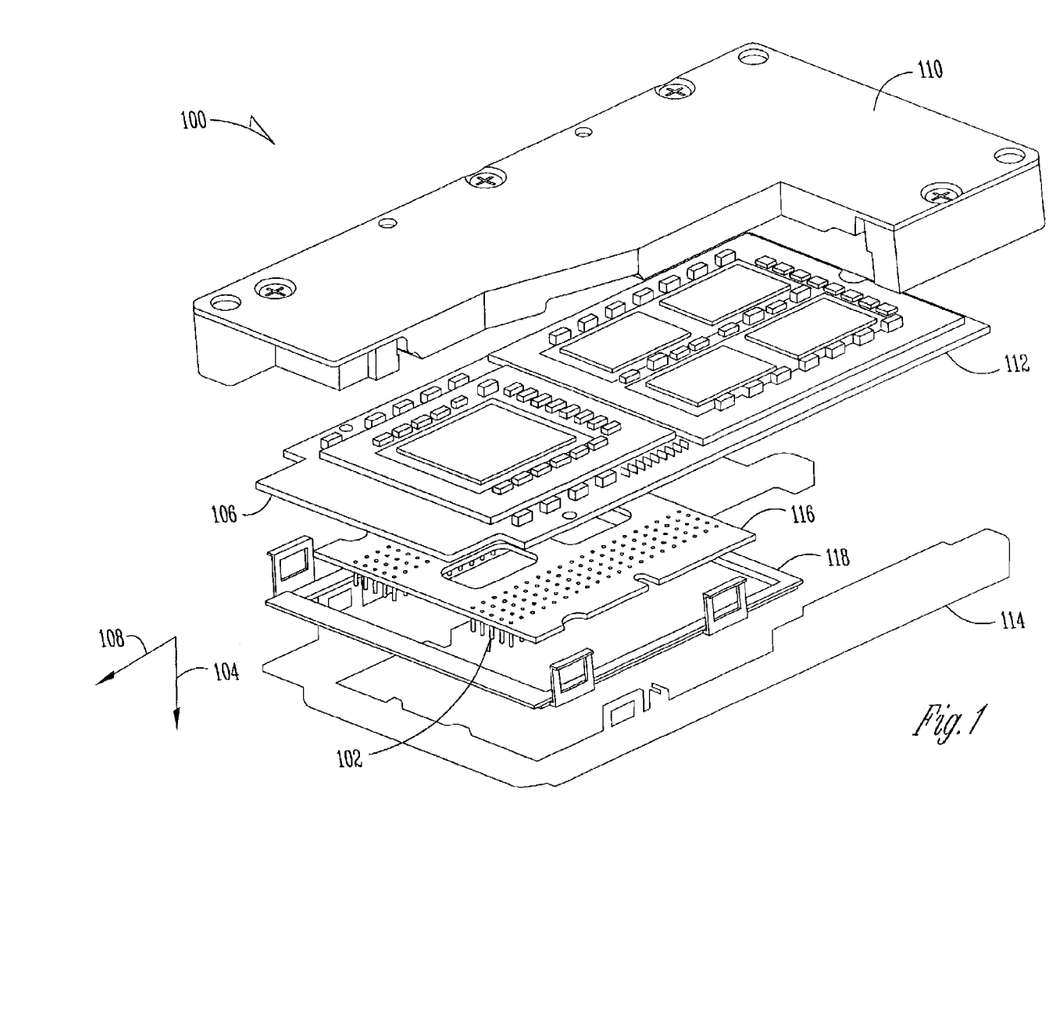
FIG. 1 is an exploded, perspective view of an example of a CPU package or cartridge with signal pins extending in one direction and a power tab extending in another direction in accordance with the present invention.

FIG. 1 is an exploded, perspective view of an example of an IC or CPU cartridge 100 or package, such as an Itanium™ CPU cartridge, for use with the present invention. The CPU cartridge 100 has a pin grid or array 102 extending in one direction or axis 104 and a power tab 106 extending in another direction or axis 108 substantially orthogonal to the one axis 104. The cartridge 100 includes a housing 110 that fits over a CPU printed circuit board 112 and attaches to a retaining member 114. The pin array 102 may be formed on a separate circuit board 116 that is connected to the CPU board 112 by a retainer arrangement 118.

Figure 2:
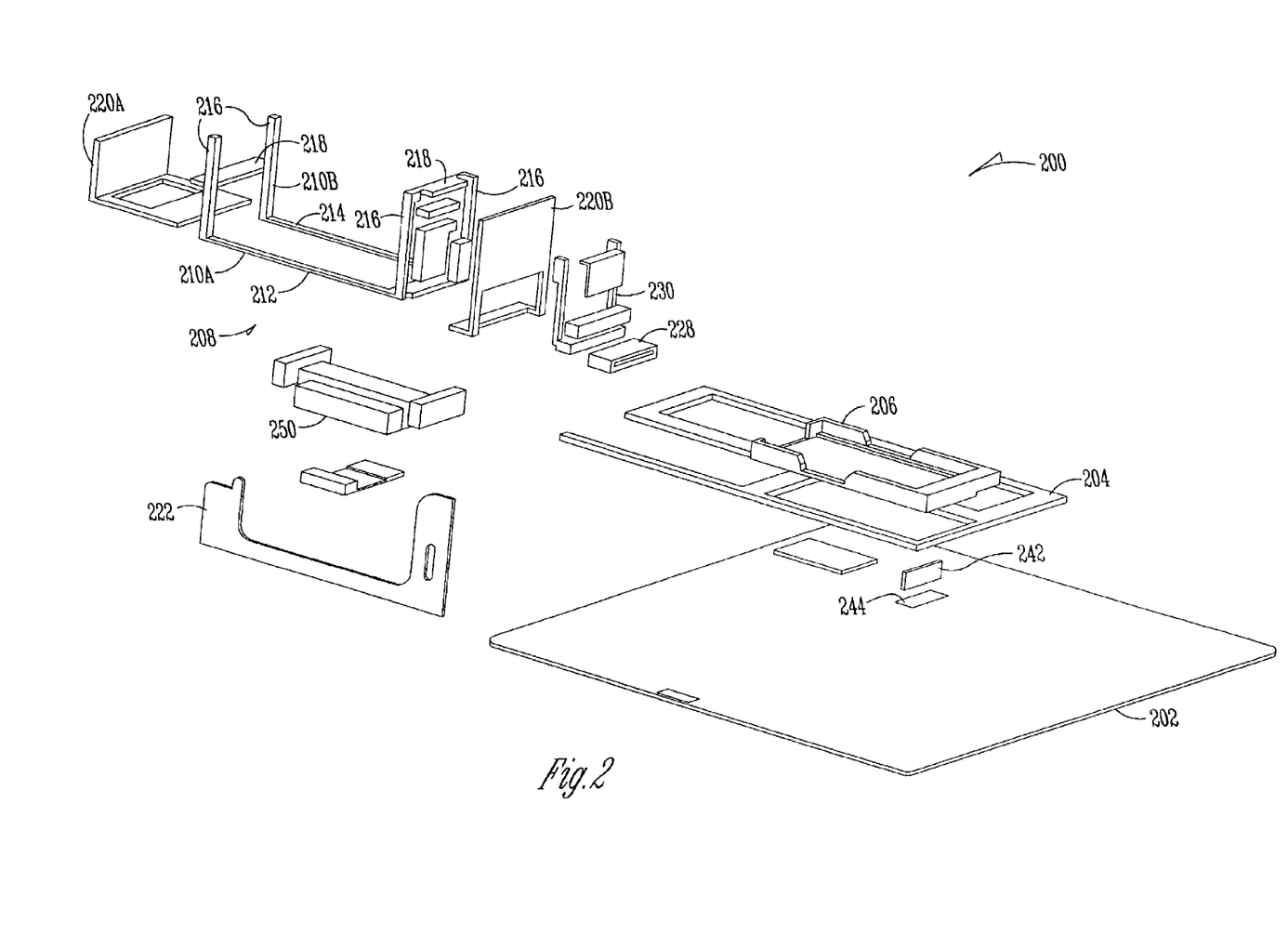
FIG. 2 is an exploded, perspective view of a system for testing an IC or CPU in accordance with the present invention.

Referring to FIG. 2, at least a portion of a system 200 for testing a CPU cartridge 100 is shown. The system 200 includes a printed circuit board or motherboard 202. A component mounting structure 204 is attached to the motherboard 202 and a socket 206 to receive the signal pins 102 of the CPU cartridge 100 is mounted to the mounting structure 204. In accordance with the present invention, the system 200 includes a floating and self-aligning suspension system 208. The floating and self-aligning suspension system 208 includes an inner frame 210. The inner frame 210 includes a first base member 212 and a second base member 214. A stanchion member 216 extends from an end of each of the first and second base members 212 and 214 substantially perpendicular to the base members 212 and 214. The stanchion members 216 may be integrally formed with the base members 212 and 214 to form two substantially U-shaped structures 210A and 210B. Each of the U-shaped structures 210A and 210B may be interconnected by cross-members 218. The suspension system 208 also includes an outer frame 220. The outer frame 220 includes a first plate 220A and a second plate 220B. A side guard 222 is attached to the first and second plates 220A and 220B on each side of the outer frame 220 (only one side guard 222 is shown in FIG. 2).

Figure 3:
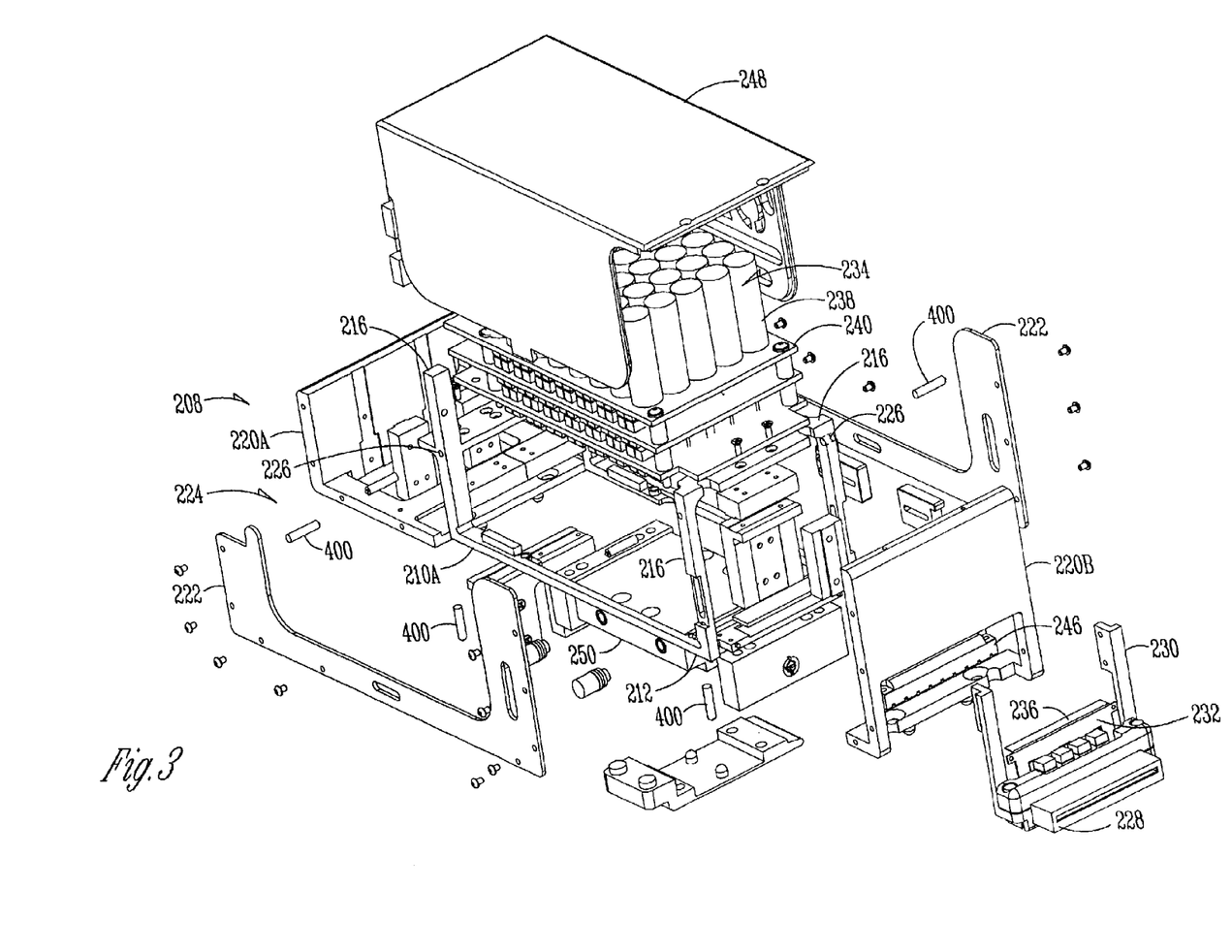
FIG. 3 is a detailed, exploded view of a floating and self-aligning suspension system and capacitor bank for connection to an IC or CPU in accordance with the present invention.

Referring also to FIG. 3 which is a detailed exploded view of the suspension system 208, in accordance with the present invention, a biasing arrangement 224 or mechanism is mounted to the inner frame 210 and contacts the outer frame 220 to allow the inner frame 210 to float or move independently in multiple different directions relative to the outer frame 220. The biasing arrangement 224 may include a plurality of plunger assemblies or mechanisms 400 or similar devices that permit the inner frame 210 to float within the outer frame 220.

Figure 4:
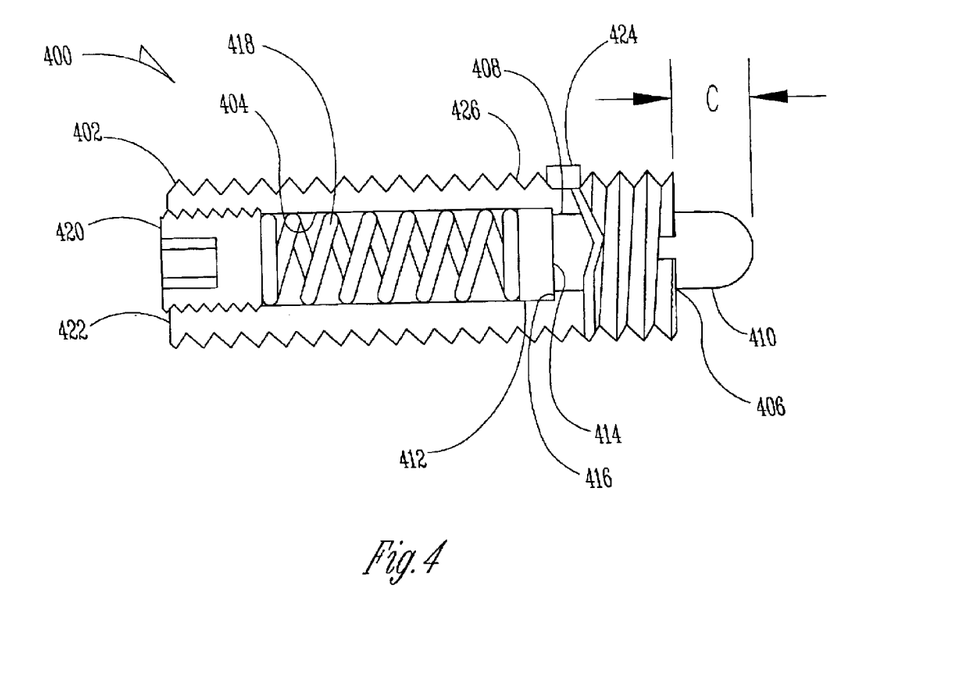
FIG. 4 is a cross-sectional view of an example of a plunger assembly for use with the present invention.

FIG. 4 shows a detailed cross-section of a plunger assembly 400 that may be used with the present invention. The plunger assembly 400 includes a substantially cylindrical body 402. The cylindrical body 402 is preferably threaded so that the plunger assembly 400 can be screwed into a threaded opening 226 formed in the inner frame 210. A hole 404 is formed through the body 402 and the hole 404 has a smaller opening 406 at one end. A plunger 408 is disposed in the hole 404. The plunger 408 includes a rounded, bullet shaped end 410 that extends a predetermined length "C" out from the smaller opening 406 and an opposite end 412 with a lip 414 that engages an interior edge 416 of the smaller opening 406 of the hole 404 to retain the plunger 408 within the hole 404. The plunger assembly 400 also includes a spring 418 disposed within the hole 404 and in contact with the lip end 412 of the plunger 408 to force the rounded or bullet end 410 to extend out of the smaller opening 406. A retaining cap 420 may be inserted into an end 422 of the hole 404 opposite to the one end with the smaller opening 406. The retaining cap 420 retains the spring 418 and plunger 408 within the body 402. The plunger assembly 400 may also include a locking feature 424 to permit adjustment of the length "C." The locking feature 424 may be a set screw inserted into a side wall 426 of the cylindrical body 402 and in contact with the plunger 408. The set screw may then be tightened to retain the plunger 408 at a desired length.

The plunger assemblies 400 may be mounted proximate to each end of the first and second base members 212 and 214 with the rounded, bullet end 410 of each plunger 408 extending outwardly from the inner frame 210 or in a direction substantially opposite to the stanchion members 216 to contact the outer frame 220. Plunger assemblies 400 may also be mounted on each of the stanchions 216 with the rounded ends 410 extending outwardly from the inner frame 210 to contact the outer frame plates 220A and 220B. Accordingly, when the inner frame 210 is inserted within the outer frame 220, the inner frame may move independently along at least two axes of motion relative to the outer frame 220.

Figure 5:
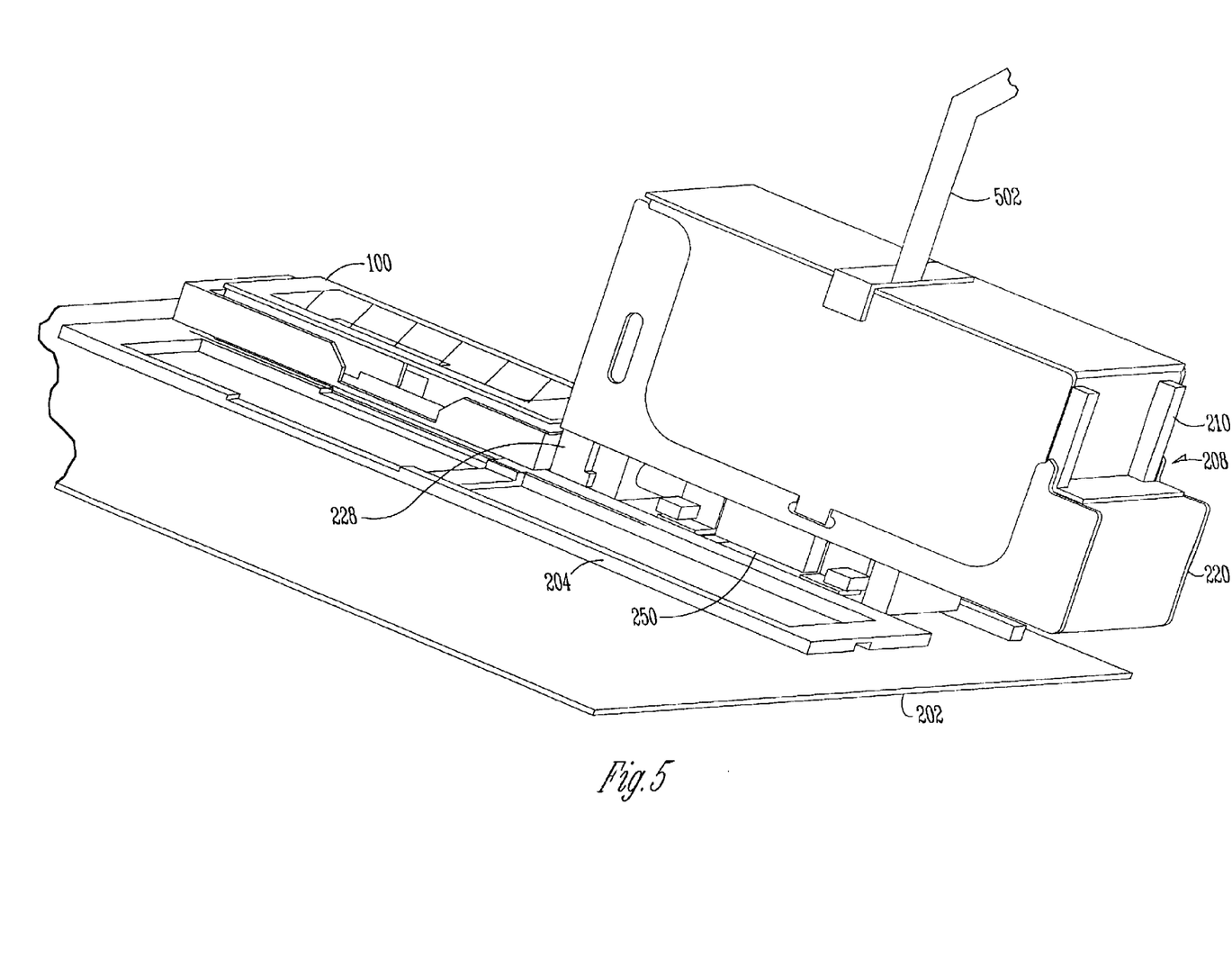
FIG. 5 is a perspective view of the floating and self-aligning suspension system and capacitor bank assembled with the CPU package in accordance with the present invention.
Figure 6:
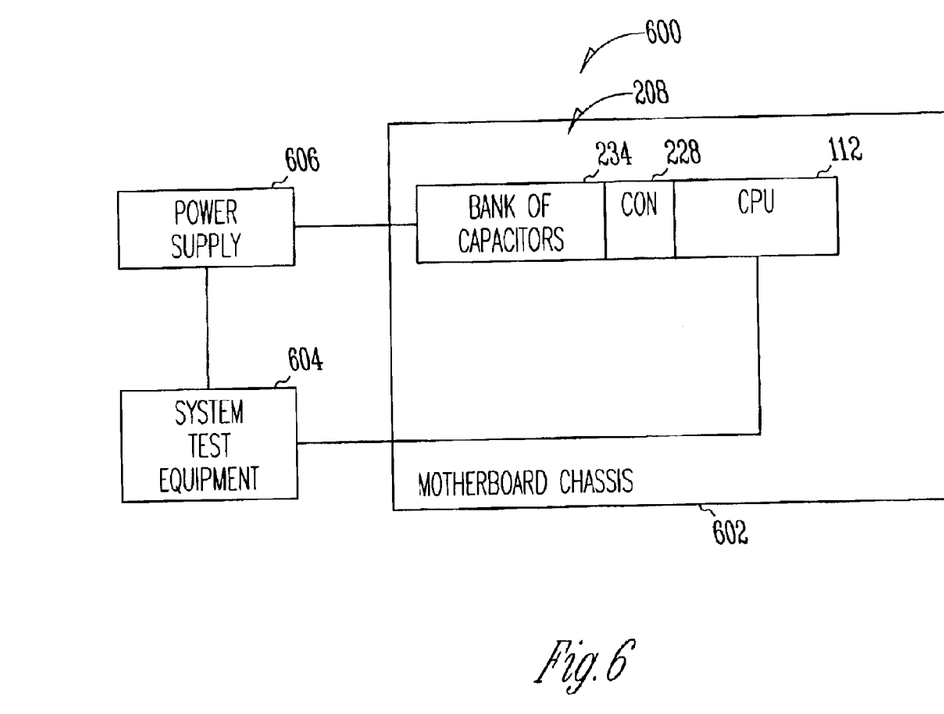
FIG. 6 is a block schematic diagram of a system for testing CPUs or ICs in accordance with the present invention.

Referring back to FIGS. 2 and 3, a connector 228 is mounted to a bracket 230 and the bracket 230 is mounted to the inner frame 210. A multiple conductor flex cable 232 (FIG. 3) is attached to the connector 228 at one end and connects to a bank of capacitors 234 or "cap farm" at another end 236. Each of the capacitors 238 of the bank of capacitors 234 are mounted to a multiple level platform 240 and the platform 240 is attached to the inner frame 210. The bank of capacitors 234 will be connected at one end as close as possible to the high power CPU 112 when the floating and self-aligning suspension system 208 is positioned on the motherboard 202 with the connector 228 attached to the power tab 106 of the CPU 112 as shown in FIG. 5. The bank of capacitors 234 are connected at another end by another portion of the flex cable 232 to a power contact 242 and a ground contact 244 on the motherboard 202. A compression contact 246 connects the other portion of the flex cable 232 to the power and ground contacts 242 and 244. As will be described in more detail below, the motherboard 202 may be connected to an external voltage or power supply 606 (FIG. 6). The capacitors 238 are connected in parallel between the external power supply 606 and the CPU 112 or IC to condition the voltage or power to provide the large current transient (di/dt) required by some high power CPUs 112, such as the Itanium™ CPU as manufactured by Intel. The flex cable 232 and the bank of capacitors 234 should be capable of carrying at least 100 amperes of current. A cap farm cover assembly 248 may be positioned over the bank of capacitors 234 to protect the capacitors 238 from damage.

Referring to FIG. 5, an actuator 250 will contact the floating and self-aligning suspension system 208 when the system 208 is positioned by a robotic arm 502 or other mechanical device in proper position on the mounting structure 204 on the motherboard 202. The actuator 250 will then move the suspension system 208 in the direction of actuation as illustrated by the arrow. The inner frame 210 and the connector 228 will move independently of the outer frame 220 of the system 208 to permit the connector 228 to self-align with and slip onto the power tab 106 of the CPU 112 without the need of any additional alignment pins or other structure.

FIG. 6 is a block schematic diagram of an example of a system 600 for testing the CPU 112 or similar device that utilizes the floating and self-aligning suspension system 208 of the present invention. The system 600 includes a motherboard chassis 602 in which the motherboard 202 is contained. The chassis 602 is connected to a tester or system test equipment 604. The motherboard chassis 602 provides the signal connections to the CPU 112 for testing and evaluation of the CPU 112. The system test equipment 604 is also connected to the external power supply 606 to control operation of the power supply 606 which is also connected to the bank of capacitors 234 for conditioning the power applied to the CPU 112. The system test equipment 604 tests the CPU 112 by booting up various operation systems and running actual software applications.

Figure 7:
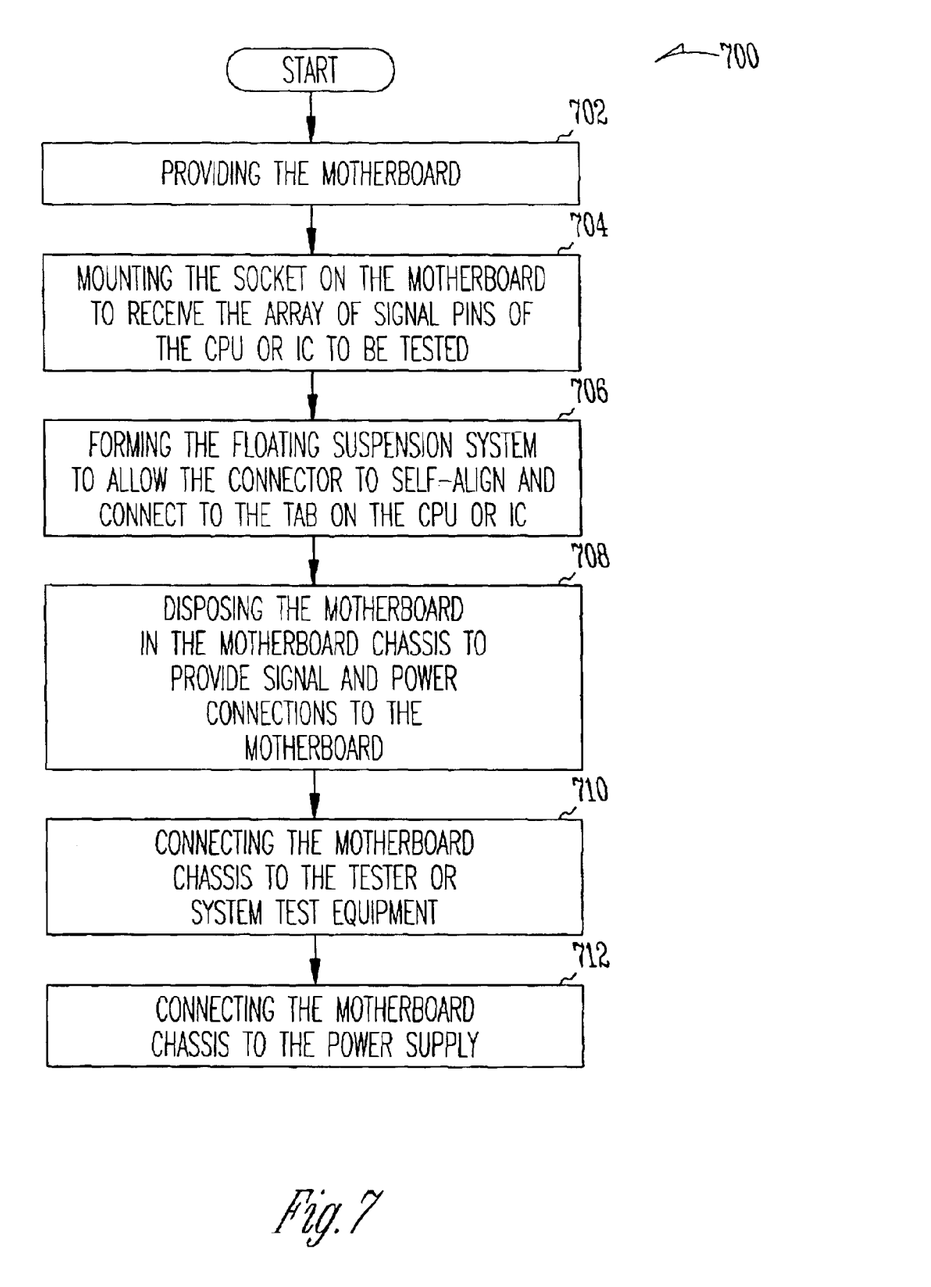
FIG. 7 is a flow graph of a method for making a system for testing a CPU or IC in accordance with the present invention.

FIG. 7 is a flow graph of a method 700 for making the system 600 for testing the CPU 112 or IC in accordance with the present invention. In step 702, the motherboard 202 (FIG. 2) or similar mounting structure is provided. The socket 206 is mounted on the motherboard 202 in step 704 to receive the array of signal pins 102 (FIG. 1) of the CPU 112 to be tested. In step 706, the floating and self-aligning suspension system 208 is formed to allow the connector 228 to self-align and connect to the tab 106 on the CPU 112. In step 708, the motherboard 202 is disposed in the motherboard chassis 602 to provide signal and power connections to the motherboard 602. The motherboard chassis 602 is connected to the tester or system test equipment 604 in step 710 and to the power supply 606 in step 712.

Figure 8:
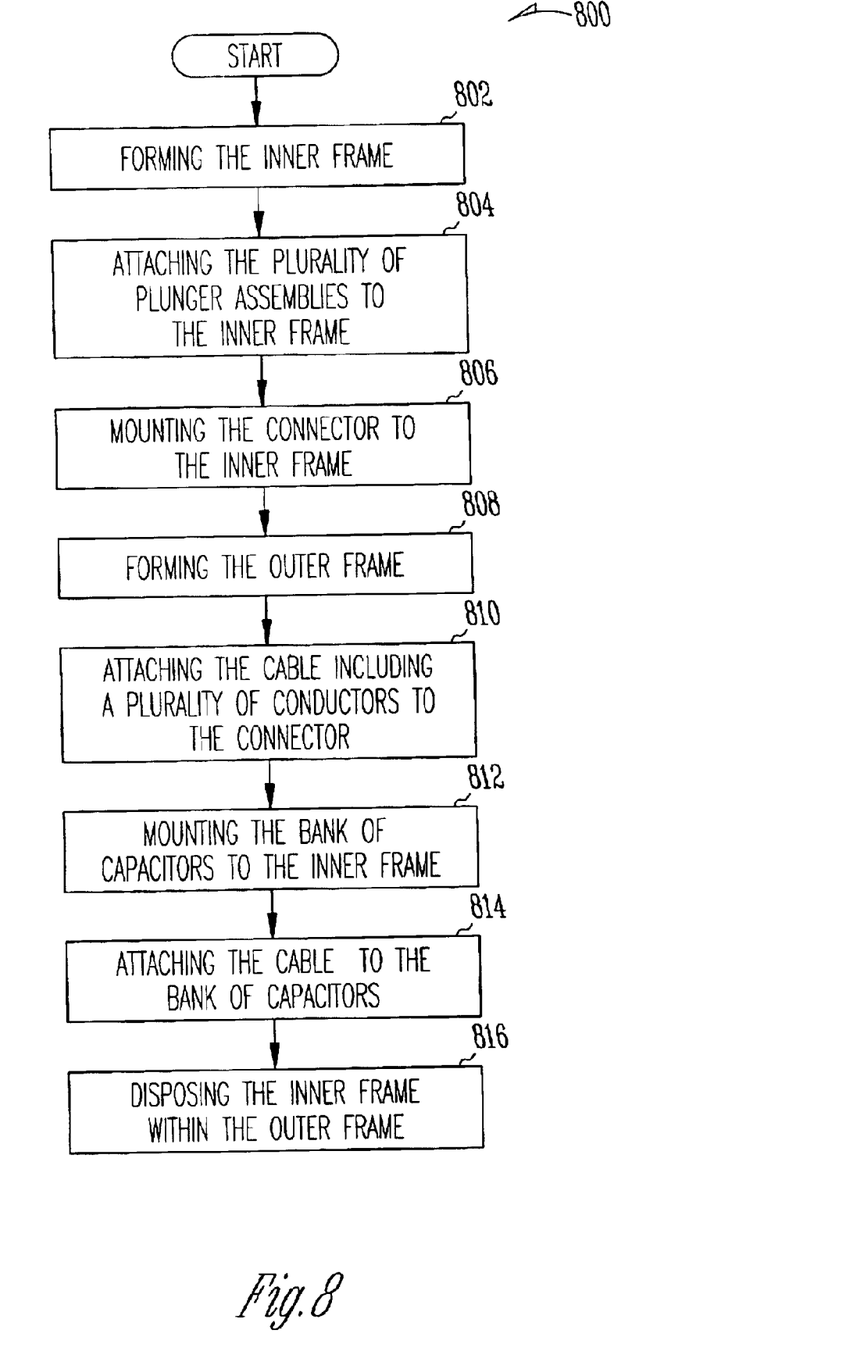
FIG. 8 is a flow graph of a method for making a floating and self-aligning suspension system in accordance with the present invention.

FIG. 8 is a flow graph of a method 800 for making the suspension system 208 in accordance with the present invention. In step 802, the inner frame 210 is formed. The biasing arrangement 224 or plurality of plunger assemblies 400 are attached to the inner frame 210 in step 804 and the connector 228 is mounted to the inner frame 210 in step 806. In step 808, the outer frame 220 is formed and in step 810, the multiple conductor cable 232 is attached to the connector 228. The bank of capacitors 234 are mounted to the inner frame 210 in step 812 and the multiple conductor cable 232 is connected to the capacitor bank 234 in step 814. The inner frame 210 is disposed within the outer frame 220 in step 816.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A floating and self-aligning suspension system, comprising:
   a frame including first and second base members extending substantially parallel to one another and a stanchion member extending from each end of the first and second base members;
   at least two plunger assemblies attached to each of the first and second base members and extending from the first and second base members in a direction substantially opposite to the stanchion members to permit movement of the frame along a first axis relative to an assembly;
   at least one other plunger assembly attached to each stanchion member and extending from each stanchion member to permit movement of the frame along at least a second axis relative to the assembly; and
   a connector mounted to the frame, wherein the frame is movable along at least the first and second axes for self alignment and attachment of the connector to the assembly.

2. The floating and self-aligning suspension system of claim 1, wherein each plunger assembly comprises:
   a body;
   a hole formed through the body, the hole having a smaller opening at one end of the body;
   a plunger disposed in the hole and including one end extending a predetermined length out of the smaller opening and an opposite end with a lip for contacting an interior edge of the smaller opening of the hole to retain the plunger within the hole;
   a spring disposed within the hole in contact with the lip end of the plunger to bias the plunger and force the one end to extend out of the smaller opening; and p1 a retaining cap to retain the spring and plunger within the body.

3. The floating and self-aligning suspension system of claim 2, wherein the body of the plunger assembly is substantially cylindrical and an exterior of the body is threaded for attachment to the frame.

4. The floating and self-aligning suspension system of claim 2, wherein the plunger assembly includes a locking feature to adjust the predetermined length of the plunger extending out of the smaller opening.

5. The floating and self-aligning suspension system of claim 1, further comprising:
   a bank of capacitors mounted to the frame; and
   a cable connecting the bank of capacitors to the connector, wherein the bank of capacitors and the cable are moveable along at least the two axes of motion with the frame to permit the connector to electrically connect the bank of capacitors to the assembly.

6. The floating and self-aligning suspension system of claim 5, wherein the bank of capacitors is coupleable to an external power supply.

7. The floating and self-aligning suspension system of claim 1, further comprising an outer frame within which the frame is disposed, wherein the frame can move relative to the outer frame to permit alignment of the connector to a mating connector on the assembly.

8. The floating and self-aligning suspension system of claim 1, wherein the assembly is a central processing unit including a plurality of signal pins extending in one direction and a power tab extending in another direction for attachment to the connector.

9. The floating and self-aligning suspension system of claim 1, wherein the assembly comprises a integrated circuit including a pin array extending in one direction and a tab extending in another direction to require multiple directions of motion to socket pin array and tab of the integrated circuit and wherein the frame is movable to permit the connector to self-align and connect to the tab of the integrated circuit.

10. A floating and self-aligning suspension system, comprising
    a frame;
    a biasing mechanism mounted to the frame to permit the frame to move relative to another structure, wherein the biasing member is a plunger assembly; and
    a connecter mounted to the frame and movable with the frame for self-alignment and attachment to an assembly, the connector operable to attach to the assembly.

11. The floating and self-aligning suspension system of claim 10, wherein the biasing mechanism comprises a plurality of plunger assemblies.

12. The floating and self-aligning suspension system of claim 10, further comprising:
    a bank of capacitors mounted to the frame; and
    a cable connecting the bank of capacitors to the connector.

13. The floating and self-aligning suspension system of claim 10, wherein the other structure is an outer frame into which the frame is disposed.

14. The floating self-aligning suspension system of claim 13, further comprising an actuator to move the outer frame, wherein the frame and connector will move independent of the outer frame to self-align and attach the connector to a power tab of the assembly.

15. The suspension system of claim 14, wherein the assembly is an integrated circuit having an array of signal pins extending in one direction and a power tab extending in another direction for attachment to the connector.

16. The suspension system of claim 10, wherein the frame comprises:
    a first base member;
    a second base member;
    at least one cross-member connected to the first and second base members; and
    a plurality of stanchion members, one stanchion member extending from each end of the first and second base members; and wherein the biasing mechanism comprises:
    at least two plunger assemblies attached to each of the first and second base members and extending outwardly from the frame to contact the outer frame; and
    a plunger assembly attached to each stanchion member and extending outwardly from the frame to contact the outer frame.

17. A method of making a floating and self-aligning suspension system, comprising:
    forming an inner frame;
    attaching a biasing arrangement to the inner frame, wherein the biasing arrangement comprises a plunger assembly;
    mounting a connector to the inner frame, the connector operable to attach the inner frame to another element;
    forming an outer frame; and disposing the inner frame within the outer frame, wherein the biasing arrangement permits the inner frame to move relative to the outer frame.

18. The method of claim 17, wherein attaching the biasing arrangement comprises attaching a plurality of plunger assemblies to the inner frame to contact the out frame when the inner frame is disposed within the outer frame.

19. The method of claim 17, wherein forming the inner frame comprises:

forming a first substantially U-shaped frame member;
forming a second substantially U-shaped frame member;
forming at least one cross-member; and
connecting the first and second substantially U-shaped frame members together with the at least one cross-member.

20. The method of claim 17, further comprising:
attaching a cable including a plurality of conductors to the connector;
mounting a bank of capacitors to the inner frame; and
attaching the cable to the bank of capacitors.

* * * * *